United States Patent
Manakli

(10) Patent No.: US 9,235,132 B2
(45) Date of Patent: Jan. 12, 2016

(54) LARGE-MESH CELL-PROJECTION ELECTRON-BEAM LITHOGRAPHY METHOD

(75) Inventor: Serdar Manakli, Meyrie (FR)

(73) Assignee: Commissariat A L'Energie Atomique et Aux Energies Alternatives, Paris (FR)

( * ) Notice: Subject to any disclaimer, the term of this patent is extended or adjusted under 35 U.S.C. 154(b) by 562 days.

(21) Appl. No.: 13/641,125

(22) PCT Filed: Apr. 13, 2011

(86) PCT No.: PCT/EP2011/055861
§ 371 (c)(1),
(2), (4) Date: Nov. 14, 2012

(87) PCT Pub. No.: WO2011/128391
PCT Pub. Date: Oct. 20, 2011

(65) Prior Publication Data
US 2013/0201467 A1    Aug. 8, 2013

(30) Foreign Application Priority Data

Apr. 15, 2010 (FR) ..................................... 10 52866

(51) Int. Cl.
| | |
|---|---|
| *G03B 27/32* | (2006.01) |
| *G03B 27/54* | (2006.01) |
| *G03C 5/00* | (2006.01) |
| *G21G 5/00* | (2006.01) |
| *H01J 3/14* | (2006.01) |
| *G03F 7/20* | (2006.01) |
| *B82Y 10/00* | (2011.01) |
| *B82Y 40/00* | (2011.01) |
| *H01J 37/317* | (2006.01) |

(52) U.S. Cl.
CPC ............. *G03F 7/70091* (2013.01); *B82Y 10/00* (2013.01); *B82Y 40/00* (2013.01); *H01J 37/3174* (2013.01); *H01J 2237/31764* (2013.01); *H01J 2237/31776* (2013.01); *Y10S 430/143* (2013.01)

(58) Field of Classification Search
CPC .......... B82Y 10/00; B82Y 40/00; G03F 1/20; G03F 1/78; G03F 7/0002; G03F 7/2059; G03F 7/70091; Y10S 430/143
USPC .......... 250/396 R, 398, 492.1–492.3; 355/53, 355/67, 77; 378/34, 35; 430/5, 296, 942
See application file for complete search history.

(56) References Cited

U.S. PATENT DOCUMENTS 5,808,310 A    9/1998    Yamashita et al.
6,069,684 A    5/2000    Golladay et al.
(Continued)

FOREIGN PATENT DOCUMENTS

| FR | 2959026 A1 | 10/2011 | |
|---|---|---|---|
| KR | 2000-0043250 A * | 7/2000 | ............ H01L 21/027 |
| WO | 2011/128393 A1 | 10/2011 | |

*Primary Examiner* — Colin Kreutzer
(74) *Attorney, Agent, or Firm* — Baker & Hostetler LLP

(57) ABSTRACT

A lithography method based on the projection of cells, notably direct-write electron-beam lithography. One of the main limitations of the methods of this type in the prior art is the writing time. To overcome this limitation, according to the method of the invention, the size of the cells is increased to the maximum aperture of the lithography device. Advantageously, this size increase is obtained by modifying the size of the apertures of the projection stencil level closest to the substrate to be etched. Advantageously, a strip is added to the outside of the block to be etched onto which is radiated a dose calculated to optimize the process energy latitude. Advantageously, this strip is spaced apart from the edge of the block to be etched. Advantageously, the projected cells are not adjoining.

14 Claims, 4 Drawing Sheets

(56) References Cited

U.S. PATENT DOCUMENTS

| | | |
|---|---|---|
| 2002/0153494 A1 | 10/2002 | Simizu |
| 2002/0162088 A1* | 10/2002 | Inanami et al. ................. 716/19 |
| 2008/0203324 A1* | 8/2008 | Fujimura et al. ......... 250/492.23 |
| 2010/0058279 A1 | 3/2010 | Fujimura et al. |

* cited by examiner

LARGE-MESH CELL-PROJECTION ELECTRON-BEAM LITHOGRAPHY METHOD

CROSS-REFERENCE TO RELATED APPLICATIONS

This application is a National Stage of International patent application PCT/EP2011/055861, filed on Apr. 13, 2011, which claims priority to foreign French patent application No. FR 10 52866, filed on Apr. 15, 2010, the disclosures of each of which are incorporated by reference in their entireties.

FIELD OF THE DISCLOSED SUBJECT MATTER

The present invention applies to the field of electron-beam lithography.

BACKGROUND

To enable patterns whose critical dimension is less than 50 nm to be etched, methods for correcting increasingly complex optical distortions have to be incorporated in the optical photolithography methods both at the mask design and production stage and at the exposure stage. The costs of the equipment and of the developments for a new technology generation increase accordingly in very high proportions. These days, the critical dimensions that can be accessed in photolithography are greater than or equal to 65 nm. The 32-45 nm generation is currently in development and there is no viable solution foreseen for the technological nodes less than 22 nm. For its part, electron-beam lithography now allows for the etching of 22 nm patterns; it does not require any mask and offers a fairly short development time, which guarantees a better responsiveness and flexibility in the production of enhancements of the technologies and of the designs. On the other hand, the production times are structurally substantially higher than in photolithography since an exposure has to be produced in steps (with a "stepper"), whereas photolithography requires only a layered exposure. For the designs with repetitive patterns such as memory circuits and gate arrays, a cell projection technology has been developed in which a complete pattern (or cell) is etched in a single shot. A method of this kind is described in U.S. Pat. No. 5,808,310.

In this cell projection technology, the technology expert repeatedly comes up against the problem of reducing the writing time and therefore the number and the duration of the shots in order to reduce the time and the cost of production of a component.

SUMMARY

The present invention provides a response to this problem by enlarging the cell mesh and by correlatively reducing the radiated doses, which makes it possible to reduce the writing time. Also in this way it is possible to provide a uniform dosage over the entire surface of the block to be etched, except in the vicinity of its edges. Advantageously, in a technology of 22 nm critical dimension, a 2.4 $\mu m^2$ cell yields a reduction in the number of shots, and therefore of the production time, by a factor close to 4.

To this end, the invention provides a radiating lithography method based on projection of at least one block onto a resin-coated substrate comprising a step of fracturing said block into individual cells to be projected onto said substrate and a step of formation of said cells by a radiating source, wherein the size of said individual cells is dimensioned by the maximum aperture of said method.

Advantageously, the dosage of the radiated energy is uniform for all the individual cells of said at least one block, except in the vicinity of the edges of said block.

Advantageously, at least one row of individual cells is located outside of the edges of said block to be etched.

Advantageously, the individual cells not situated in the vicinity of the edges of the block to be etched are not adjoining.

Advantageously, the mesh of the individual cells is greater by approximately 125% than the normal mesh of the cells of the process.

Advantageously, the normal mesh of the cells of the process is approximately 1.6 $\mu m \times 1.6$ $\mu m$.

Advantageously, the method of the invention also comprises a step of calculating the width of shots to be located outside of a block edge, a step of calculating the dose modulation on the edges of said block, said calculations being linked by a functional relationship involving the process energy latitude, and a step of locating said shots outside of said block.

Advantageously, the step of calculating the dose modulation on the edges of said block comprises a substep of calculating said dose by convolution of the radiated dose with the pattern of the edge.

Advantageously, the step of calculating the dose modulation on the edges of said block comprises a substep of calculating said dose by invoking a table of parameters.

Advantageously, the method of the invention also comprises a step of calculating at least one spacing between the edge of the block and the shots to be located outside of said block.

Advantageously, the size of the block to be etched is substantially equal to 500 nm.

To implement the method, the invention also provides a computer program comprising program code instructions configured to execute a radiating lithography method based on projection of at least one block onto a resin-coated substrate when the program is run on a computer, said program comprising a module for fracturing said block into individual cells to be projected onto said substrate and a module capable of controlling the formation of said cells by a radiating source, wherein said latter module is capable of controlling the formation of said individual cells to a dimension determined by the maximum aperture of said process.

Advantageously, the module for controlling the formation of said cells generates a dosage of the radiated energy that is uniform for all the individual cells of said at least one block, except in the vicinity of the edges of said block.

Advantageously, the computer program of the invention also comprises a module capable of performing the calculation of the width of shots to be located outside of a block edge and the calculation of the dose modulation on the edges of said block, said calculations being linked by a functional relationship involving the process energy latitude, and a module capable of producing the location of said shots outside of said block.

Advantageously, the computer program of the invention also comprises a module capable of performing the calculation of at least one spacing between the edge of the block and the shots to be located outside of said block.

The invention also makes it possible to reduce the number of high doses (and therefore the number of shots of long duration). Overall, it therefore yields a cumulative reduction in the production times. The invention is also particularly advantageous when it is applied to a design with all the blocks more than 5 μm wide, with all the opaque blocks and with input/output blocks.

BRIEF DESCRIPTION OF THE DRAWINGS

The invention will be better understood, its various features and advantages will become apparent from the following description of a number of exemplary embodiments and its appended figures in which.

DETAILED DESCRIPTION

Figure 1:
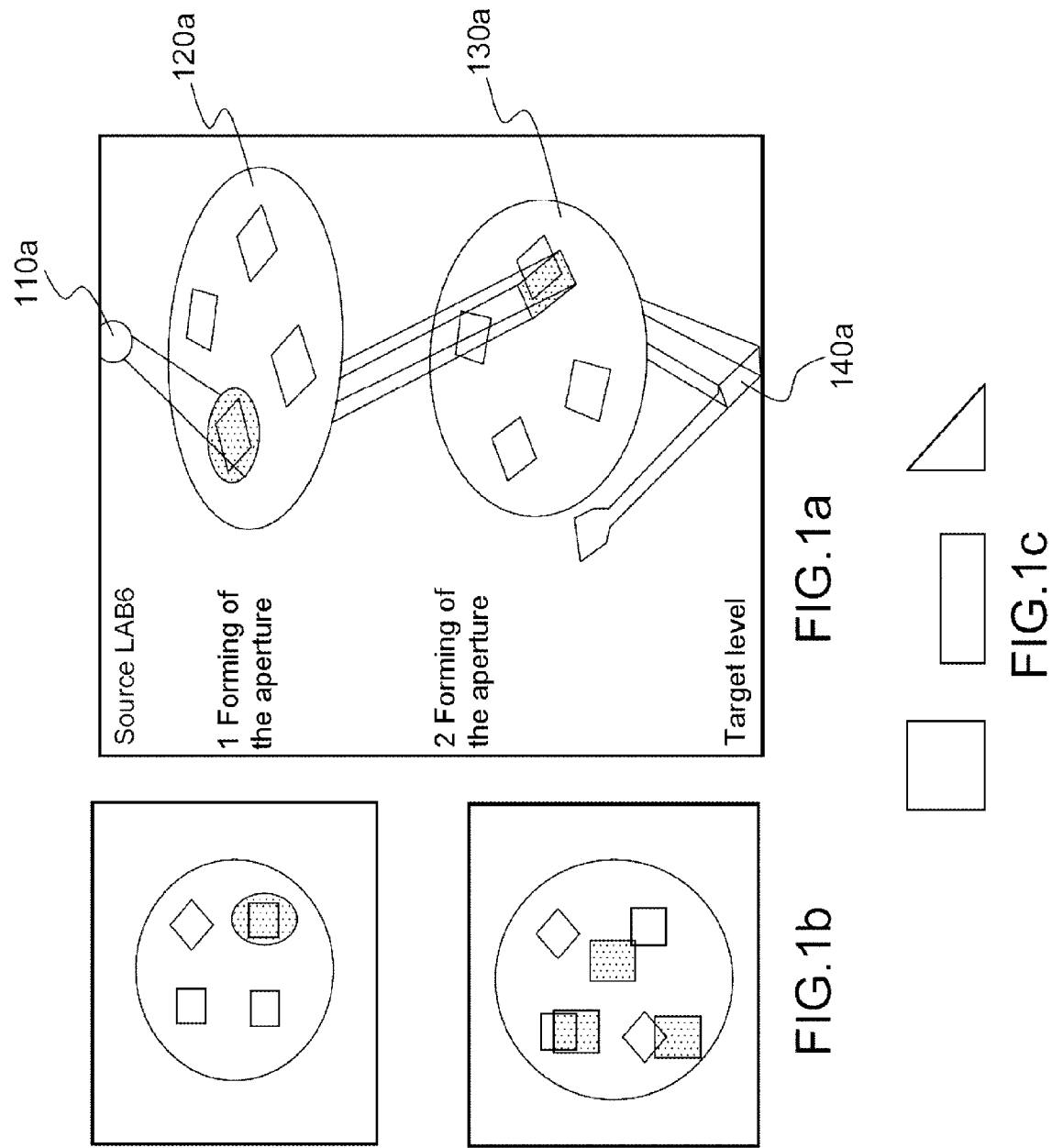
FIGS. 1a, 1b and 1c respectively represent the two levels of an electron-beam lithography device, the illustration of their superposition and various results of said superposition.

FIGS. 1a, 1b and 1c respectively represent the two levels of an electron-beam lithography device, the illustration of their superposition and various results of said superposition.

In a conventional electron-beam lithography device, the pattern to be etched is first fractured into individual functional cells, 140a, which can be etched on a resin-coated substrate. Said resin-coated substrate may be a silicon wafer, a wafer made of another material III-V or of glass, on which the functions of an electronic circuit are intended to be etched by direct radiating writing, said radiation being able to be an electron-beam radiation or an ion-beam radiation. Said substrate may also be a mask which will then be used to etch a wafer consisting of the same materials as above, said etching using an electron-beam or ion-beam etching method or an optical lithography method. Hereinafter in the description, the method of the invention will be illustrated by exemplary embodiments according to an electron-beam lithography method based on direct writing on a wafer of any kind, without embodiments not limiting the full scope of the invention.

The method of the invention is particularly suited to the reproduction of functional blocks with repetitive patterns such as dynamic, static, random-access or read-only, rewritable or non-rewritable memories, as well as to circuits of the gate array type.

A machine capable of performing the method of the invention after adaptations to its driving software and/or at least one of the stencil supports, which are explained hereinafter in the description, is, for example, a VISTEC™ or ADVANTEST™ brand machine.

In such a method used as an exemplary embodiment, a source of electrons, 110a, radiates onto the substrate via two levels of stencils, 120a and 130a, which comprise individual figures such as squares, rectangles or triangles, represented in FIG. 1c.

The individual figures of the two levels of stencils, 120a and 130a, are composed between them, so that the dimensions of the individual cell which will be etched on the substrate, 140a, correspond to the desired design. The composition of the two stencils is performed in a manner known to a person skilled in the art. Software configured for this purpose drives the rotation of the stencil supports so that the individual figures of the two stencils are correctly aligned at the moment of the emission of the shot by the source of electrons, 110a.

According to the invention, the mesh of an individual cell 140a which is etched on the substrate is chosen to be the largest possible according to the parameters of the machine used as guaranteed by the manufacturer for an optimum resolution over patterns. Thus, when the resolution of the lithography machine is guaranteed by the manufacturer for a mesh of 1.6 μm×1.6 μm, which corresponds to a technology of 45 and 32 nm critical dimension, it is possible to use a mesh of approximately 2.4 μm×2.4 μm for patterns to be etched which do not include high resolution lines. This is the maximum aperture of the machine, which can be used without loss of resolution in the case of these applications. There is thus obtained an increase of 125% in the surface area of the average mesh of the cells in the middle of the pattern, i.e. a division by approximately two of the number of shots and therefore of the exposure time. Despite its advantages, the increase in the size of the cells is not an idea which comes naturally to the mind of a person skilled in the art whose priority is to enhance the resolution. He or she is even dissuaded from it by the machine manufacturers who normally impose a maximum aperture setting that allows for use without modification of the setting of the machine for all types of patterns, notably at high resolution. Thus, Vistec guarantees its performance levels for a mesh of 1.6×1.6 μm at maximum, whereas it is possible to advantageously use shots of a much bigger size (2.4 μm×2.4 μm). It is possible to envisage going even further with other machines. Thus, these dimension parameters are given purely as an illustration and are nonlimiting, the principle of the invention still being to use the maximum aperture of the method that makes it possible to generate the individual cells that have the greatest surface area.

It will be noted that a modification of the aperture on the first stencil imposes a complex setting procedure, which dissuades against such a modification. On the other hand, as recommended for implementing the invention, it is possible to modify the aperture on the $2^{nd}$ stencil without setting the machine parameters.

Figure 2:
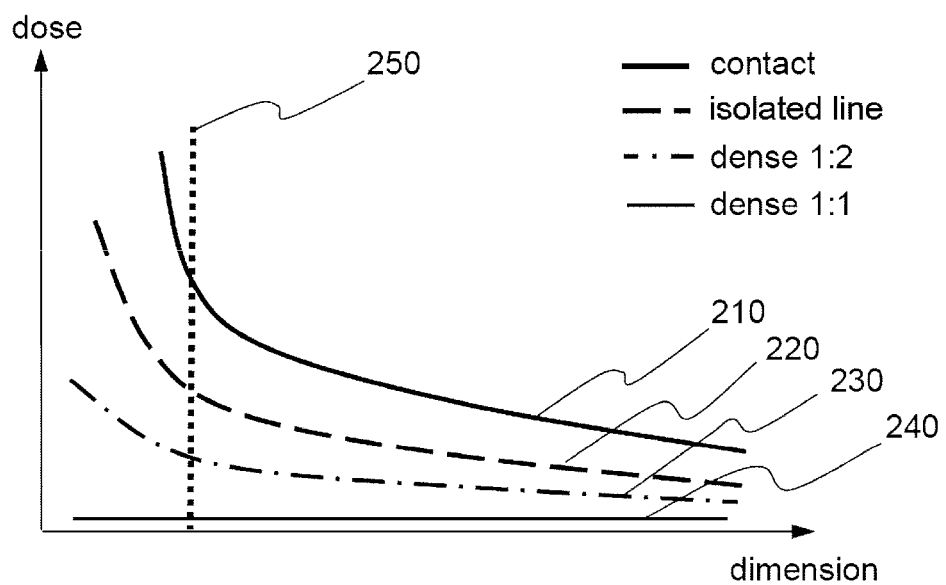
FIG. 2 graphically represents the dose radiated by an electron-beam lithography device according to the critical dimension of the design for four types of patterns to be etched.

FIG. 2 graphically represents the dose radiated by an electron-beam lithography device according to the dimension of the design for four types of patterns to be etched.

The four curves, 210, 220, 230 and 240, represent the trends of doses needed to etch patterns according to their dimension in four cases, respectively:

a $1^{st}$ line inserted into a dense network where the lines and the spaces have equal widths (1:1);

a $2^{nd}$ line inserted into a semi-dense network where the spaces have a width equal to twice that of the lines (1:2);

an isolated line;

a set of contact points.

The vertical straight line, 250, represents the critical dimension of the method.

Figure 3:
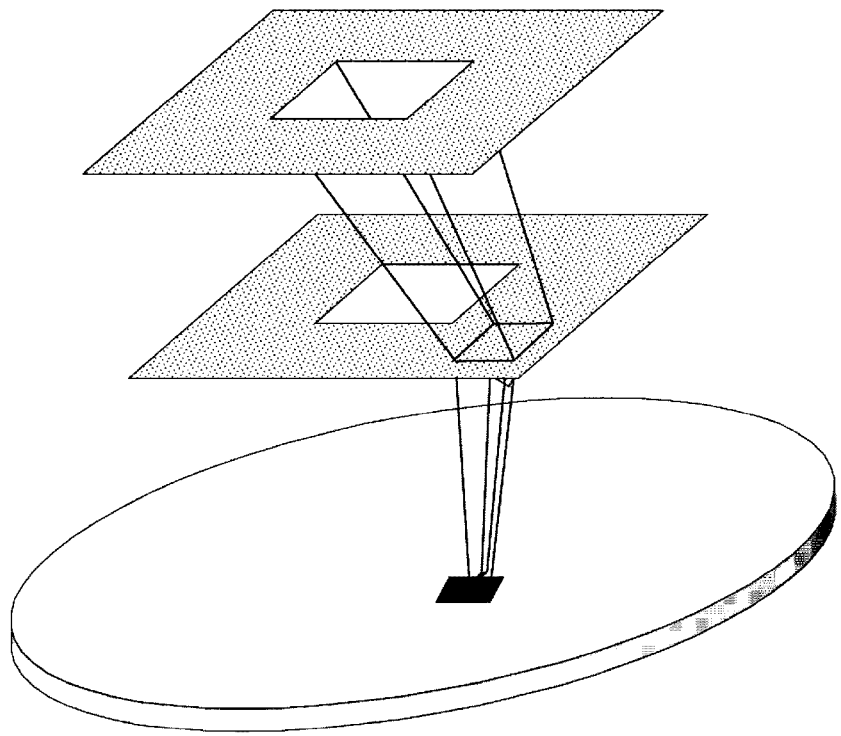
FIG. 3 represents how a cell is etched in one embodiment of the invention.

FIG. 3 represents the manner in which a cell is etched in one embodiment of the invention.

The two stencil levels 120a and 130a have to be positioned one relative to the other dynamically in such a way that the source of electrons, 110a, can combine the two apertures of these stencils to etch on the substrate a cell 140a of average mesh 2.4 µm×2.4 µm, or another mesh corresponding to the maximum aperture of the lithography machine used.

Figure 4A:
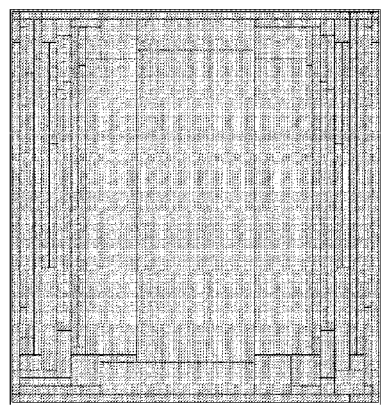
FIGS. 4a and 4b respectively represent a set of blocks to be etched and this set etched by a method of the prior art.
Figure 4B:
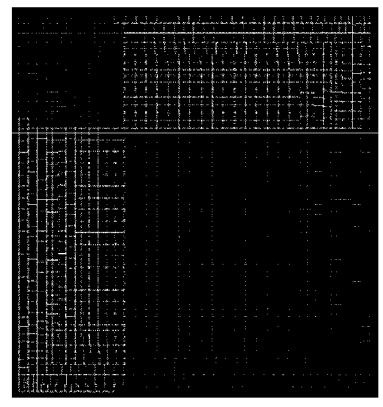

FIGS. 4a and 4b respectively represent a set of blocks to be etched and this set etched by a method of the prior art.

FIG. 4a represents the block to be etched after fracturing. FIG. 4b represents the etched block.

Figure 5A:
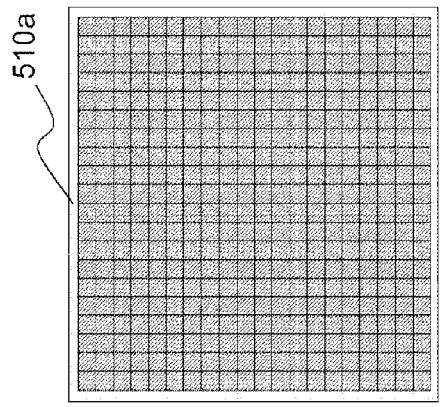
FIGS. 5a and 5b respectively represent a view of the level of dummy cells to be etched and this set etched by a method according to one embodiment of the invention.
Figure 5B:
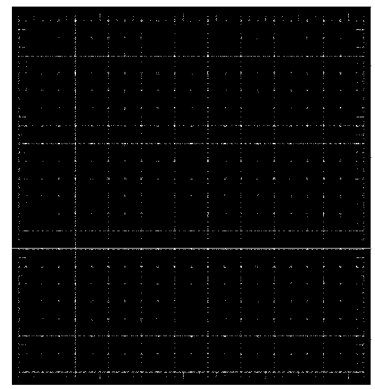

FIGS. 5a and 5b respectively represent a view of the level of cells to be etched and this set etched by a method according to one embodiment of the invention.

FIG. 5a represents the block to be etched after fracturing. A strip 510a will be noted on the edge, which represents a radiated dose added to the outside of the pattern to be etched. This strip is presented as a variant.

In this advantageous embodiment, a space is left between the pattern to be etched and the added strip and, possibly, at least one second external strip is added, also separated from the first by a space. In all the configurations, this spacing enhances the energy latitude of the method. By means of experiments, it is found that a spacing of between 0.2 times the strip width and 3 times the strip width is effective, according to the method disclosed by the patent application filed by the applicant of this application under the French patent application number 1052862.

In the method described by this patent application, which targets a correction of the proximity effects inherent in the lithography methods for geometries less than 50 nm, the dose to be applied outside of the pattern is calculated either by convolution of the radiated dose with the pattern to be etched or by using a table of parameters. The combined calculation of the dose modulation to be applied and of the size of the new pattern is performed in such a way as to preserve the process energy latitude according to a calculation of which an example is given below as commentary to FIG. 7.

FIG. 5b represents the etched block. The visual comparison of FIGS. 4b and 5b shows the very significant reduction in the number of cells and therefore in the exposure time which results from the use of the method of the invention.

An important feature of the invention can also be observed, according to which the dosage of the radiated energy is uniform over all the individual cells formed, except in the vicinity of the edges (inside or outside of the block to be etched).

One of the difficulties linked to the use of the method of the invention is the control of the aperture on the first stencil. In practice, as a general rule, this procedure presupposes a complete setup. On the other hand, the resizing of the patterns on the second stencil makes it possible to obtain an aperture increase without having to perform this setup. This variant embodiment is therefore particularly advantageous.

Figure 6A:
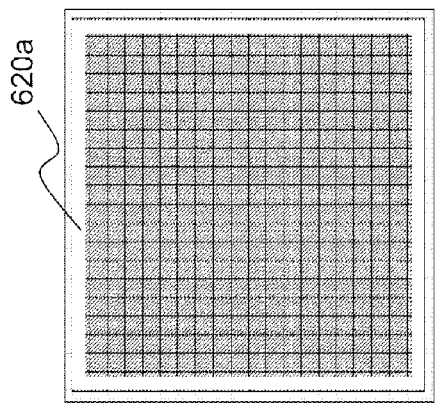
FIGS. 6a and 6b respectively represent a view of the level of cells to be etched and this set etched by a method according to a variant of the invention.
Figure 6B:
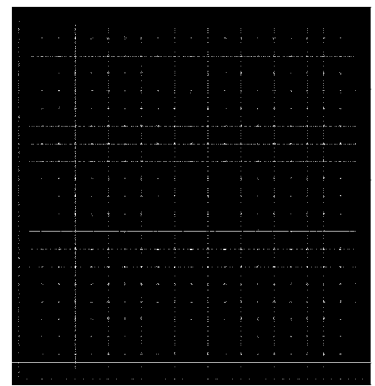

FIGS. 6a and 6b respectively represent a view of the level of cells to be etched and this set etched by a method according to another variant of the invention.

In FIG. 6a, a spacing, 620a, can be observed between the strip added to the outside of the pattern, 510a, of FIG. 5a and the pattern to be etched. In some configurations, this spacing allows an optimization of the process energy latitude of the method. Another advantageous embodiment consists in leaving a space between the pattern to be etched and the added strip and, possibly, in adding at least one second external strip also separated from the first by a space. In all the configurations, this spacing enhances the process energy latitude. By means of experiments, it is found that a spacing of between 0.2 times the strip width and 3 times the strip width is effective.

Figure 7:
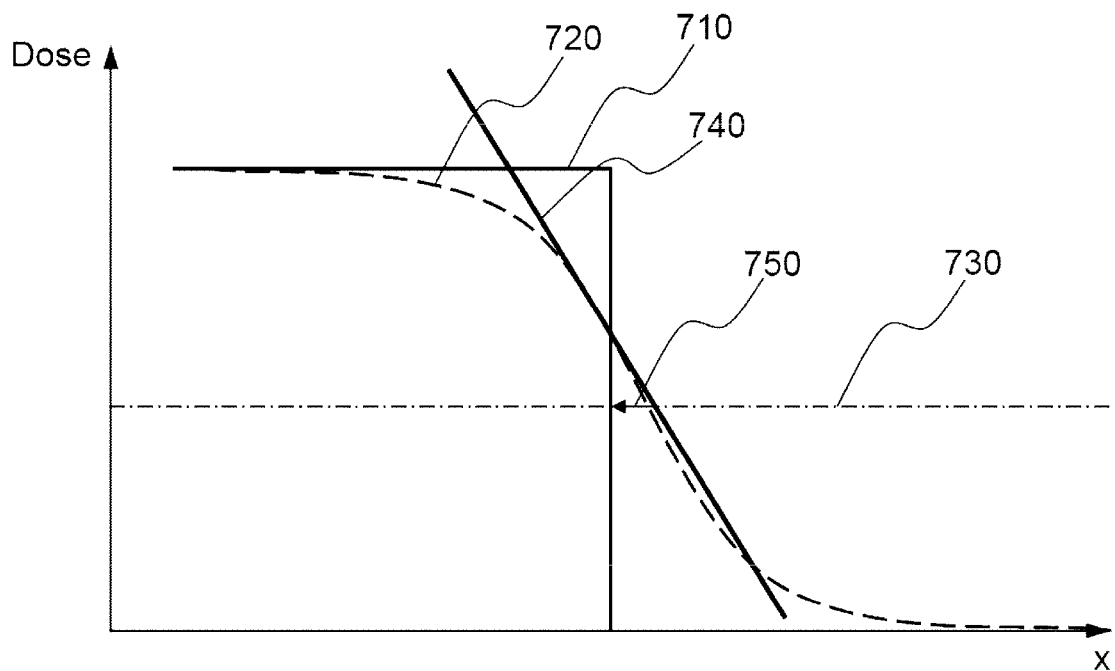
FIG. 7 illustrates the method of resizing the edges of the block to be etched according to a variant of the invention.

The calculation of the positioning of the additional strip 510a is illustrated by FIG. 7 in an embodiment in which the dose modulation is calculated from a convolution of the radiated dose with the pattern to be etched.

The geometry of the additional pattern is then modified in at least one dimension to optimize the process energy latitude. More specifically, the displacement, 750, to be performed in that dimension is calculated by searching for the intersection of the straight line, 740, tangential to the received dose curve, 720, at the point where the dose received is equal to the sensitivity threshold of the resin at 0.5 with the straight line, 730, which represents said sensitivity threshold, then by performing the displacement to the point of intersection of the latter straight line with the profile of the radiated dose, 710.

The combined dose/patterns calculation can be iterated two or three times.

The modulation of the dose to be applied on the patterns can also be calculated from a table of parameters without convolution calculation, notably when the modulation is applied only to the shots outside of the patterns, the other shots being applied to the normalized value of the method, or to a value lower by the order of 30% than the latter.

Figure 8:
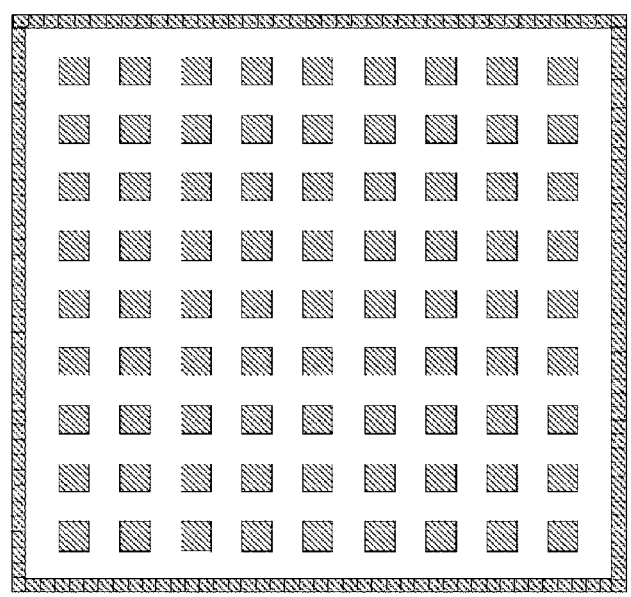
FIG. 8 illustrates an embodiment of the invention in which the cells to be etched are not adjoining.

FIG. 8 illustrates an embodiment of the invention in which the cells to be etched are not adjoining.

In this exemplary embodiment, the individual cells are arranged in a non-adjoining manner. In practice, the cells are not necessarily juxtaposed. They can advantageously be separated from one another. Inasmuch as the writing time is linked to the product (surface area to be isolated×dose), it is possible, in certain configurations, to find a good trade-off by not juxtaposing the cells. It will be noted that the example illustrated by FIG. 8 is in no way limiting and that the spacing between exposed areas is not necessarily equal to their size.

The method of the invention has been described in an example of application to an electron-beam lithography method based on direct writing. It can also be applied to another direct writing method using other particles such as ions or photons or to electron-beam lithography methods or to an optical writing method using masks.

The examples described above are therefore given to illustrate certain embodiments of the invention. They in no way limit the scope of the invention which is defined by the following claims.

The invention claimed is:

1. A radiating lithography method based on projection of at least one block onto a resin-treated substrate comprising:
   a step of fracturing said block into individual cells to be projected onto said substrate; and
   a step of formation of said cells by a radiating source,
   wherein a mesh of said individual cells is dimensioned by a maximum aperture of an equipment used for the lithography method, and
   wherein a dosage of a radiated energy from the radiating source has a first uniform value for all the individual cells located inside said at least one block, and not adjoining the edges of said block, and a second uniform value different from the first uniform value, for a row of cells located at one of an interior vicinity of the edges and an exterior of said block.

2. The lithography method of claim 1, wherein the dosage of the radiated energy is uniform for all the individual cells of said at least one block, except in the vicinity of the edges of said block.

3. The lithography method of claim 1 wherein at least one row of individual cells is located outside of the edges of said block to be etched.

4. The lithography method of claim 1, wherein the individual cells not situated in the vicinity of the edges of the block to be etched are not adjoining.

5. The lithography method of claim 1, wherein the mesh of the individual cells is greater by approximately 125% than a normal mesh of the cells of the method, the normal mesh being approximately 1.6 µm×1.6 µm.

6. The lithography method of claim 1; further comprising:
a step of calculating a width of shots to be located outside of a block edge;
a step of calculating a dose modulation on the edges of said block, said dosage modulation being dependent upon a process energy latitude of the lithography method; and
a step of locating said shots outside of said block.

7. The lithography method of claim 6, wherein the step of calculating the dose modulation on the edges of said block comprises a substep of calculating said dose by convolution of the radiated dose with the pattern of the edge.

8. The lithography method of claim 6, wherein the step of calculating the dose modulation on the edges of said block comprises a substep of calculating said dose by invoking a table of parameters.

9. The lithography method of claim 7, further comprising a step of calculating at least one spacing between the edge of the block and the shots to be located outside of said block.

10. The lithography method of claim 1, wherein the size of a block is substantially equal to 500 nm.

11. A non-transitory computer readable medium storing a computer program having program code instructions configured to execute a radiating lithography method based on projection of at least one block onto a resin-coated substrate when the computer program is run on a computer, said computer program comprising:
a module for fracturing said block into individual cells to be projected onto said substrate; and
a module capable of controlling the formation of said cells by a radiating source,
wherein said module is capable of controlling the formation of said individual cells to a dimension determined by a maximum aperture of an equipment used for the lithography method, and
wherein said module for controlling the formation of said cells generates a dosage of a radiated energy from the radiating source having a first uniform value for all the individual cells located inside said at least one block, and not adjoining the edges of said block, and a second uniform value different from the first uniform value, for a row of cells located at one of the interior vicinity of the edges and the exterior of said block.

12. The non-transitory computer readable medium storing the computer program of claim 11, wherein the module for controlling the formation of said cells generates a dosage of the radiated energy that is uniform for all the individual cells of said at least one block, except in the vicinity of the edges of said block.

13. The non-transitory computer readable medium storing the computer program of claim 11 further comprising
a module capable of performing the calculation of the width of shots to be located outside of a block edge and the calculation of the dose modulation on the edges of said block, said calculations being linked by a functional relationship involving the process energy latitude; and
a module capable of producing the location of said shots outside of said block.

14. The non-transitory computer readable medium storing the computer program of claim 11 further comprising a module capable of performing the calculation of at least one spacing between the edge of the block and the shots to be located outside of said block.

* * * * *